United States Patent [19]
Wassenaar et al.

[11] Patent Number: 5,371,474
[45] Date of Patent: Dec. 6, 1994

[54] DIFFERENTIAL AMPLIFIER HAVING RAIL-TO-RAIL INPUT CAPABILITY AND SQUARE-ROOT CURRENT CONTROL

[75] Inventors: Roelof F. Wassenaar, Enschede; Johan H. Huijsing, Schipluiden; Remco J. Wiegerink, Borne; Ron Hogervorst, Voorschoten, all of Netherlands; John P. Tero, Saratoga, Calif.

[73] Assignee: Philips Electronics North America Corporation, New York, N.Y.

[21] Appl. No.: 197,656

[22] Filed: Feb. 17, 1994

Related U.S. Application Data

[63] Continuation of Ser. No. 33,995, Mar. 19, 1993, abandoned, which is a continuation of Ser. No. 880,811, May 8, 1992, abandoned.

[51] Int. Cl.$^5$ ............................................. H03F 3/45
[52] U.S. Cl. .................................. 330/253; 330/258; 330/261
[58] Field of Search ................ 330/252, 253, 258, 261

[56] References Cited

U.S. PATENT DOCUMENTS

| | | | |
|---|---|---|---|
| 4,555,673 | 11/1985 | Huijsing et al. | 330/258 |
| 4,766,394 | 8/1988 | Yukawa | 330/253 |
| 4,887,048 | 12/1989 | Krenik et al. | 330/258 |
| 4,918,398 | 4/1990 | Huijsing et al. | 330/252 |
| 5,208,552 | 5/1993 | Ryat | 330/253 |

OTHER PUBLICATIONS

J. H. Huijsing & D. Linebarger, IEEE Journal of Solid-State Circuits, vol. SC-20, No. 6, Dec. 6, 1985, "Low-Voltage Operational Amplifier with Rail-to-Rail Input and Output Ranges".

P. A. L. deJong, Report: doctoral task, CMOS Rail OP AMP on low voltage, Aug. 21, 1990, p. 14.

E. Seevinck, "Generalized Transliner Circuit Principle", IEEE Journal of Solid-State Circuits, vol. 26, No. 8, Aug. 1991, pp. 1098–1102.

J. H. Botma et al, "A low-voltage CMOS Op Amp with a rail-to-rail constant-gm input stage and a class AB rail-to-rail output stage", IEEE 1993, International Symposium On circuits And Systems, pp. 1314–1317.

Primary Examiner—James B. Mullins
Attorney, Agent, or Firm—Laurie E. Gathman

[57] ABSTRACT

A differential amplifier contains a pair of differential portions (10 and 12) that together provide representative signal amplification across the full amplifier power-supply voltage range. Each differential portion normally contains a pair of like-polarity differentially coupled FETs (Q1 and Q2, Q3 and Q4) that divide a tail current ($I_N$, $I_P$) into a pair of main currents ($I_1$ and $I_2$, $I_3$ and $I_4$). The two FET pairs are complementary. A square-root circuit (24) controls the tail currents in such a way that the sum of their square roots is largely constant. Consequently, the amplifier transconductance is largely constant.

32 Claims, 5 Drawing Sheets

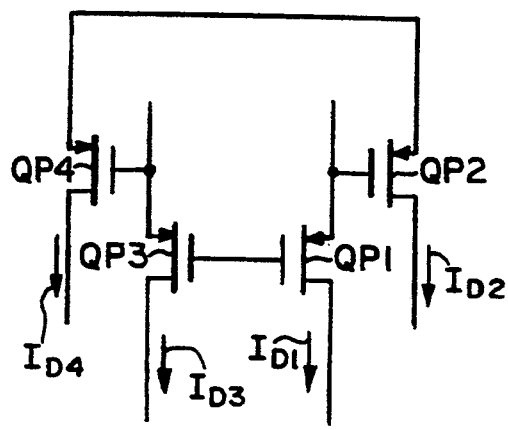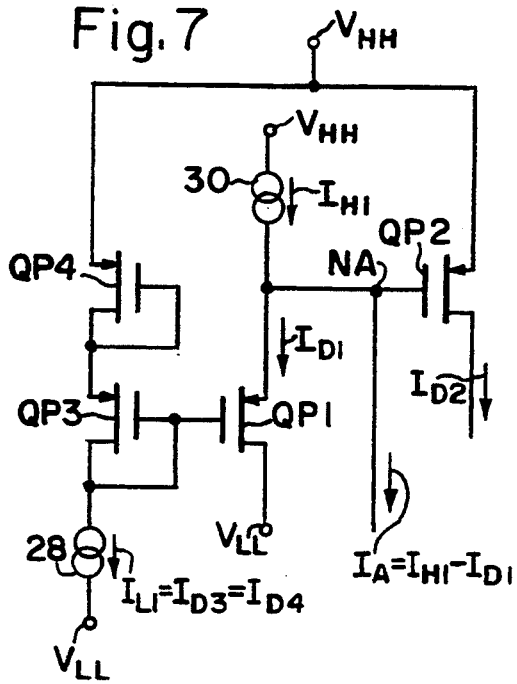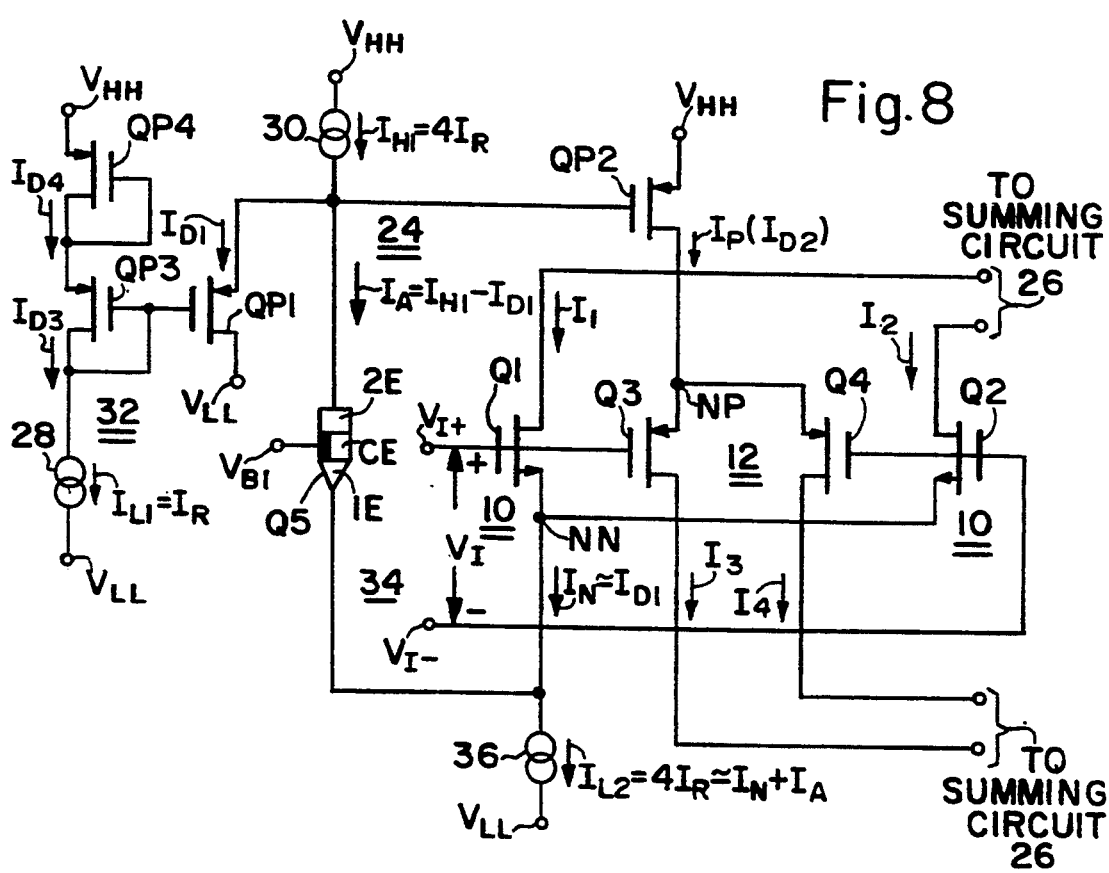

DIFFERENTIAL AMPLIFIER HAVING RAIL-TO-RAIL INPUT CAPABILITY AND SQUARE-ROOT CURRENT CONTROL

This is a continuation division of application Ser. No. 08/033,995filed Mar. 19, 1993, which is a continuation of application Ser. No. 07/880,811, filed May 8, 1992, both now abandoned.

FIELD OF USE

This invention relates to differential amplifiers that can be made in semiconductor integrated-circuit form and, more particularly, to a differential amplifier that employs complementary pairs of field-effect transistors ("FETs") for attaining rail-to-input capability.

BACKGROUND ART

Some integrated circuits need to operate on power-supply voltages that are quite low, as little as 1–3 volts. If such an integrated circuit contains an amplifier that amplifies a differential input signal, the low power-supply voltage severely constrains the voltage range of the common-mode voltage of the input signal. For this reason, a differential amplifier is often designed to have rail-to-rail input capability. That is, the amplified output signal is representative of the differential input voltage as its common-mode portion travels the full extent of the power-supply range.

A threshold voltage must be reached before a transistor becomes conductive. If the input stage of a differential amplifier utilizes only a single pair of input transistors in amplifying the input signal, achieving rail-to-rail input capability is very difficult. There is normally a high or low portion of the power-supply range where both transistors are turned off because their threshold voltages have not been reached. This problem can be circumvented by using complementary pairs of input transistors arranged in such a way that at least one of the pairs provides amplification when the common-mode input voltage is at any point in the power-supply range.

The transconductance of the input stage of a differential amplifier is an important measure of the overall performance capability of the amplifier. The input-stage transconductance, represented here by the symbol "$G_M$", is basically the rate of incremental change in total output current of the input stage to the incremental change in the differential portion of the input voltage.

Unless special precautions are taken, $G_M$ for an input stage that utilizes complementary pairs of input transistors is significantly greater when both pairs of transistors are conductive than when only one of the pairs is conductive. This variation in $G_M$ makes it difficult to optimize the frequency compensation for the amplifier when it is used in (or as) an operational amplifier with negative feedback. Significant distortion occurs at those values input common-mode voltage where each pair of input transistors switches between on and off. As a result, it is highly desirable that $G_M$ be largely constant as the common-mode voltage traverses the power-supply range.

U.S. Pat. No. 4,555,673 describes several embodiments of a differential amplifier which uses a current-steering technique to control $G_M$ for an input stage that employs complementary pairs of input transistors to attain rail-to-rail input capability. In all but one of the embodiments, the input transistors are bipolar devices.

The transconductance for a bipolar transistor varies directly with its collector current. Accordingly, the transconductance for a pair of emitter-coupled like-polarity bipolar transistors is proportional to the tail (or operating) current provided jointly to the interconnected emitters of the transistors. For the bipolar embodiments, U.S. Pat. No. 4,555,673 takes advantage of this phenomenon to steer supply current to, or away from, the input transistors in such a way that the sum of the tail currents for the two pairs of input transistors is largely constant as the common-mode input voltage moves across the full power-supply range. $G_M$ for the amplifier is then largely constant.

The input transistors in the remaining embodiment in U.S. Pat. No. 4,555,673 are source-coupled insulated-gate FETs. In contrast to a bipolar transistor whose transconductance is largely proportional to its collector current, the individual transconductance for an insulated-gate FET varies with the square root of its drain current when the FET is in strong inversion and saturation. Due to this difference, $G_M$ for the input stage in the FET embodiment cannot be maintained largely constant by simply steering current to, or away from, the sources of the FETs in such a manner that the sum of the tail currents for the two complementary pairs of FETs is largely constant.

The $G_M$ control difficulty can be better understood by examining FIG. 1 which illustrates the FET embodiment of U.S. Pat. No. 4,555,673. The input stage of this differential amplifier centers around an N-channel input portion 10 and a P-channel input portion 12 that together amplify the difference $V_I$ between individual input voltages $V_{I+}$ and $V_{I-}$. The common-mode portion $V_{CM}$ of differential input voltage $V_I$ equals ($V_{I+}$ + $V_{I-}$)/2.

The differential amplifier in FIG. 1 operates between a high supply voltage $V_{HH}$ and a low supply voltage $V_{LL}$. The range for the power-supply voltage $V_{PS}$—i.e., $V_{HH}$ − $V_{LL}$—is divided into three sub-ranges: (a) a high end range that extends from $V_{HH}$ down to a lower value referred to here as $V_{MH}$, (b) a low end range that extends from $V_{LL}$ up to a higher value termed $V_{ML}$, and (c) an intermediate range that extends between $V_{MH}$ and $V_{ML}$.

Differential portion 10 contains substantially identical N-channel insulated-gate main FETs Q1 and Q2 which provide signal amplification up to $V_{HH}$. Individual inputs $V_{I+}$ and $V_{I-}$ are supplied to the gate electrodes of FETs Q1 and Q2. Their sources are connected together at a node NN through which a tail current $I_N$ flows. Portion 10 amplifies input $V_I$ by dividing tail current $I_N$ into main currents $I_1$ and $I_2$ taken from the Q1 and Q2 drains. The difference between currents $I_1$ and $I_2$ is representative of input $V_I$ when common-mode voltage $V_{CM}$ is in the intermediate and high voltage ranges.

Similarly, differential portion 12 contains substantially identical P-channel insulated-gate main FETs Q3 and Q4 which furnish signal amplification down to $V_{LL}$. Inputs $V_{I+}$ and $V_{I-}$ are supplied to the gate electrodes of FETs Q3 and Q4. Their sources are connected together at a node NP through which a tail current $I_P$ flows. Portion 12 performs the amplification by dividing tail current $I_P$ into main currents $I_3$ and $I_4$ taken from the Q3 and Q4 drains. The difference between currents $I_3$ and $I_4$ is representative of $V_I$ when $V_{CM}$ is in the intermediate and low voltage ranges.

The remainder of the input stage shown in FIG. 1 consists of a current source 14 which supplies a constant current $I_L$, a current source 16 which supplies a constant current $I_H$, and a current-steering mechanism 18 which regulates the amounts of supply currents $I_L$ and $I_H$ provided to differential portions 10 and 12. Current-steering mechanism 18 is formed with insulated-gate FETs QN and QP and current-reversing circuits 20 and 22, all connected as indicated in FIG. 1. The input stage also contains a summing circuit which suitably combines main currents $I_1$–$I_4$ to produce one or more output currents. The summing circuit is not explicitly depicted in U.S. Pat. No. 4,555,673 and, accordingly, is not shown here.

FIG. 2 is a $G_M$ graph that is useful in understanding how the differential amplifier of FIG. 1 typically operates. For this purpose, the intermediate section of the $V_{PS}$ range needs to be subdivided into a high transition zone extending between $V_{MH}$ and a lower voltage $V_{TH}$, a low transition zone extending between $V_{ML}$ and a higher voltage $V_{TL}$, and a central portion extending between $V_{TH}$ and $V_{TL}$. As $V_{CM}$ traverses the low transition zone in the positive direction, FETs Q1 and Q2 switch from off to fully on. Likewise, FETs Q3 and Q4 switch from off to fully on when $V_{CM}$ traverses the high transition zone in the negative direction.

FETs Q1–Q4 are all fully conductive when $V_{CM}$ is in the central portion of the intermediate range. Current-steering circuit 18 is inactive. Tail current $I_N$ equals $I_L$, while tail current $I_P$ equals $I_H$. As indicated in FIG. 2, $G_M$ is constant at a nominal value $G_{MN}$ in the central portion of the intermediate range.

It is possible to select the characteristics of current-reversing circuits 20 and 22 in such a manner that $G_M$ is largely equal to $G_{MN}$ when $V_{CM}$ is in the low end range where transistors Q1 and Q2 are turned off and supply current $I_P$ is greater than $I_H$. Likewise, $G_M$ can be largely fixed at $G_{MN}$ across the high end range where FETs Q3 and Q4 are turned off and current $I_N$ is greater than $I_L$. FIG. 2 illustrates this example.

Unfortunately, $G_M$ for the high and low transition zones climbs to a value significantly greater than $G_{MN}$ due to the square-root dependence of the individual transconductance of each of FETs Q1–Q4 on its drain current. In particular, $G_M$ in the transition zones typically reaches a maximum 15% above $G_{MN}$. The increased $G_M$ in the transition zones is decidedly unattractive in some operational-amplifier applications.

There is a significant need for differential amplifiers that have FET inputs. Accordingly, it would be highly advantageous to have an FET-input differential amplifier that achieves both rail-to-rail input capability and substantially constant $G_M$ as $V_{CM}$ traverses the entire $V_{PS}$ range.

GENERAL DISCLOSURE OF THE INVENTION

The present invention is capable of meeting the foregoing objective. More specifically, the invention is a differential amplifier operable between sources of first and second (e.g., high and low) supply voltages whose difference constitutes a power-supply range consisting of a first (e.g., high) end range extending to the first supply voltage, a second (e.g., low) end range extending to the second supply voltage, and an intermediate range extending between the two end ranges. The amplifier contains first and second differential amplifying portions that operate in parallel to provide representative signal amplification across the full power-supply range. As used here to describe the relationship between two signals, "representative" means that their amplitudes have a substantially one-to-one (typically linear) relationship as long as the amplitudes are not too large.

The first differential portion amplifies a differential input signal by largely dividing a first tail current into a pair of first main currents whose difference is representative of the input signal when its common-mode voltage $V_{CM}$ is in the intermediate and first ranges. The second differential portion operates in a complementary fashion to amplify the input signal by largely dividing a second tail current into a pair of second main currents whose difference is representative of the input signal when $V_{CM}$ is in the intermediate and second ranges. As a result, the differential amplifier has rail-to-rail input capability.

The first differential portion preferably centers around a pair of like-polarity differentially coupled first main FETs that divide the first tail current into the first main currents in differential response to the input signal. The second differential portion likewise preferably centers about a pair of like-polarity differentially coupled second main FETs that split the second tail current into the second main currents in differential response to the input signal. The second main FETs are complementary—i.e., of opposite polarity—to the first main FETs.

Importantly, the present amplifier further includes a square-root circuit for controlling the tail currents in such a way that the sum of their square roots is largely constant as $V_{CM}$ traverses the entire intermediate range and into the end ranges. By virtue of the square-root current control, $G_M$ for the amplifier is largely constant across the intermediate range and into the end ranges. The variation in the sum of the square roots of the tail currents is usually less than 10% across the intermediate range. In fact, the square-root circuit normally maintains the sum of the square roots of the tail currents at a largely constant value as $V_{CM}$ traverses substantially all of the power-supply range. Consequently, $G_M$ is substantially constant across the full power-supply range.

Due to the square-root current control, the operational regimes for the present invention normally differs somewhat from those of the prior art FET-input differential amplifier mentioned above. In particular, as $V_{CM}$ moves across the intermediate range in one direction in the present invention, one of the differential portions goes from a substantially non-amplifying state to a full amplification state while the other differential portion does the opposite. There is no portion of the intermediate range in which both differential portions individually provide relatively constant amplification. In other words, the entire intermediate range in the present invention is a transition zone. This differs from the cited prior art in which the intermediate range consists of two transition zones and a middle portion where both of the differential portions individually provide relatively constant amplification.

The square-root circuit preferably achieves the square-root current-control function with a pair of primary control FETs having gate-to-source voltages whose sum is held largely constant. The gate-to-source voltages of the two control FETs are largely in a square-root relationship with their drain currents when the FETs are in strong inversion and saturation. The square-root circuit sets the tail currents at values respectively largely proportional, normally largely equal, in magnitude to the drain currents of the two control FETs. As a result, the sum of the square roots of the tail currents is maintained largely constant.

To maintain the sum of the gate-to-source voltages of the two control FETs at a largely constant value, the square-root circuit normally employs a pair of further control FETs. The gate-to-source voltage of each further control FET is maintained largely constant by forcing its drain current to be largely constant. The four control FETs are coupled together in a loop via their gate electrodes and sources. Because the sum of the gate-to-source voltages around the loop thereby equals zero, the desired voltage summation constancy is achieved.

In addition to the current-control circuit formed with the control FETs, the square-root circuit usually includes interface circuitry that furnishes the control circuit with a suitable $V_{CM}$ dependency. Taking note of the fact that the main FETs in the first differential portion are coupled together through a first node and that the main FETs in the second differential portion are coupled together through a second node, one embodiment of the interface circuitry consists of a steering circuit that adjusts a current path to the first node in response to changes in $V_{CM}$. The control circuit then provides the current path with a current determinative of the first tail current. The control circuit also provides the second tail current at the second node.

Another embodiment of the interface circuitry consists of a sensing circuit that produces an adjustment signal representative of changes in $V_{CM}$. In response to the adjustment signal, the control circuit directly provides the two nodes with the tail currents at values dependent on $V_{CM}$.

In summary, the present FET-based differential amplifier achieves rail-to-rail input capability and substantially constant $G_M$ across the full power-supply range. Signal distortion is quite low. While the invention can be implemented with the same number of transistors as the prior art FET-input differential amplifier mentioned above, the invention typically requires slightly more transistors. Nonetheless, the number of transistors is still relatively small.

The present amplifier is particularly suitable for use in (or as) an operational amplifier with negative feedback. The substantially constant $G_M$ makes it relatively easy to optimize the frequency compensation for the operational amplifier.

BRIEF DESCRIPTION OF THE DRAWINGS

FIGS. 6 and 7 are circuit diagrams for a preferred implementation of part of the square-root circuit in the amplifier of FIG. 3.

FIGS. 8 and 9 are circuit diagrams for preferred embodiments of the input sections of the amplifier of FIG. 3.

Like reference symbols are employed in the drawings and in the description of the preferred embodiments to represent the same or very similar item or items. All of the FETs shown in the drawings are enhancement-mode devices.

DESCRIPTION OF THE PREFERRED EMBODIMENTS

The present invention largely uses FETs. Nonetheless, certain parts of the invention can be alternatively implemented with bipolar transistors. The invention thus can be fabricated in both "CMOS" and "BIC-MOS" integrated-circuit technologies.

Each transistor that can be implemented as either an FET or a bipolar transistor is referred to as a general transistor in the following description. Each such general transistor has a first flow electrode (1E), a second flow electrode (2E), and a control electrode (CE) for controlling current flow between the flow electrodes. Charge carriers (either electrons or holes) that move between the flow electrodes of each general transistor originate at its first flow electrode and terminate at its second flow electrode. Current conduction between the two flow electrodes begins when the voltage between the control electrode and the first flow electrode reaches a specified threshold voltage level. The current (if any) flowing in the control electrode is much smaller than that otherwise moving between the flow electrodes.

For an implementation with an FET, its source, drain, and gate electrode respectively are the first flow, second flow, and control electrodes. These electrodes respectively are the emitter, collector, and base for a bipolar implementation of a general transistor.

Figure 3:
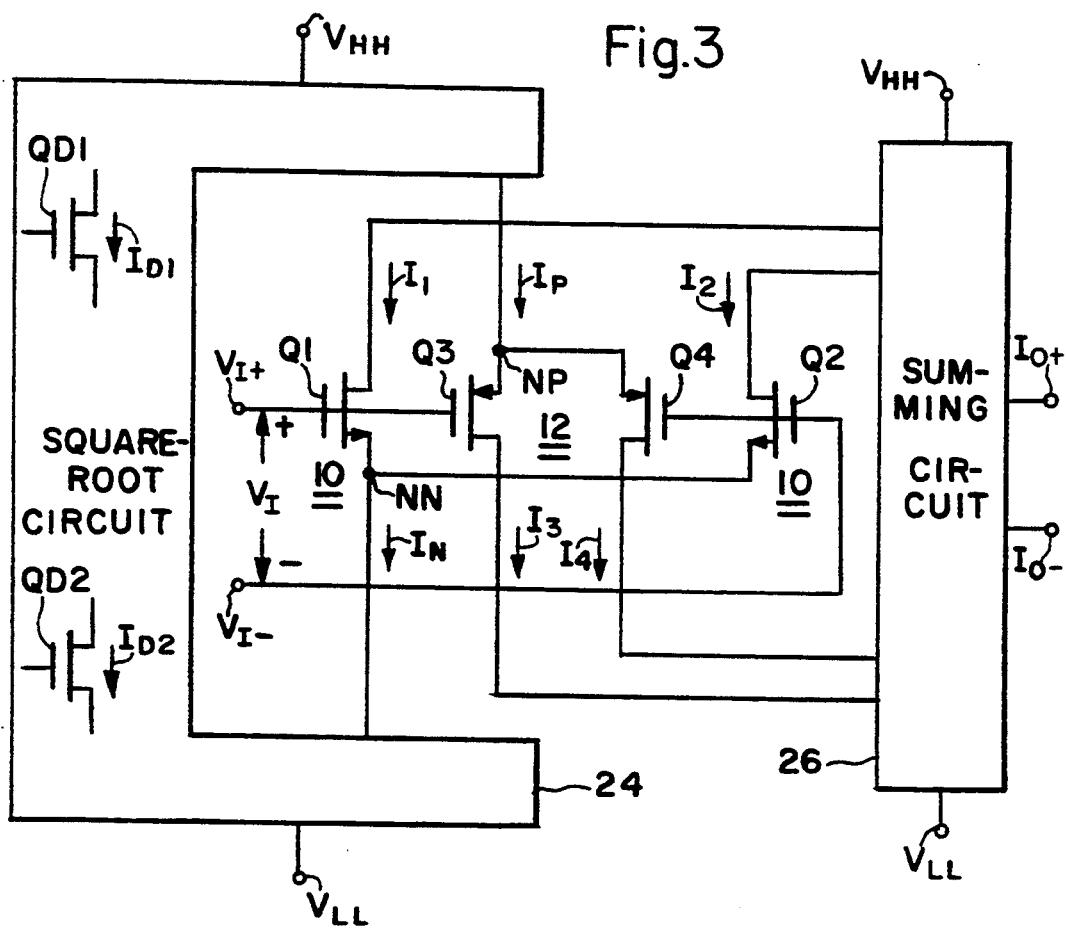
FIG. 3 is a block/circuit diagram of a differential amplifier in accordance with the invention.

Referring to FIG. 3, it illustrates a differential amplifier configured according to the teachings of the invention. This amplifier can be employed as a single-stage differential amplifier or as the input stage of a multi-stage differential amplifier suitable for an operational amplifier. The amplifier shown in FIG. 3 consists of N-channel differential portion 10, P-channel differential portion 12, a square-root circuit 24, and a summing circuit 26 that together amplify the difference $V_I$ between input voltages $V_{I+}$ and $V_{I-}$ to produce one or more amplified output signals. FIG. 3 indicates, for example, that the amplifier furnishes complementary currents $I_{o+}$ and $I_{o-}$ as amplified output signals.

The present amplifier operates between supply voltages $V_{HH}$ and $V_{LL}$. As with the prior art device of FIG. 1, the $V_{PS}$ range for the amplifier in FIG. 3 consists of a high end range extending from $V_{MH}$ up to $V_{HH}$, a low end range extending from $V_{ML}$ down to $V_{LL}$, and a relatively small intermediate range extending between $V_{MH}$ and $V_{ML}$.

Figure 1:
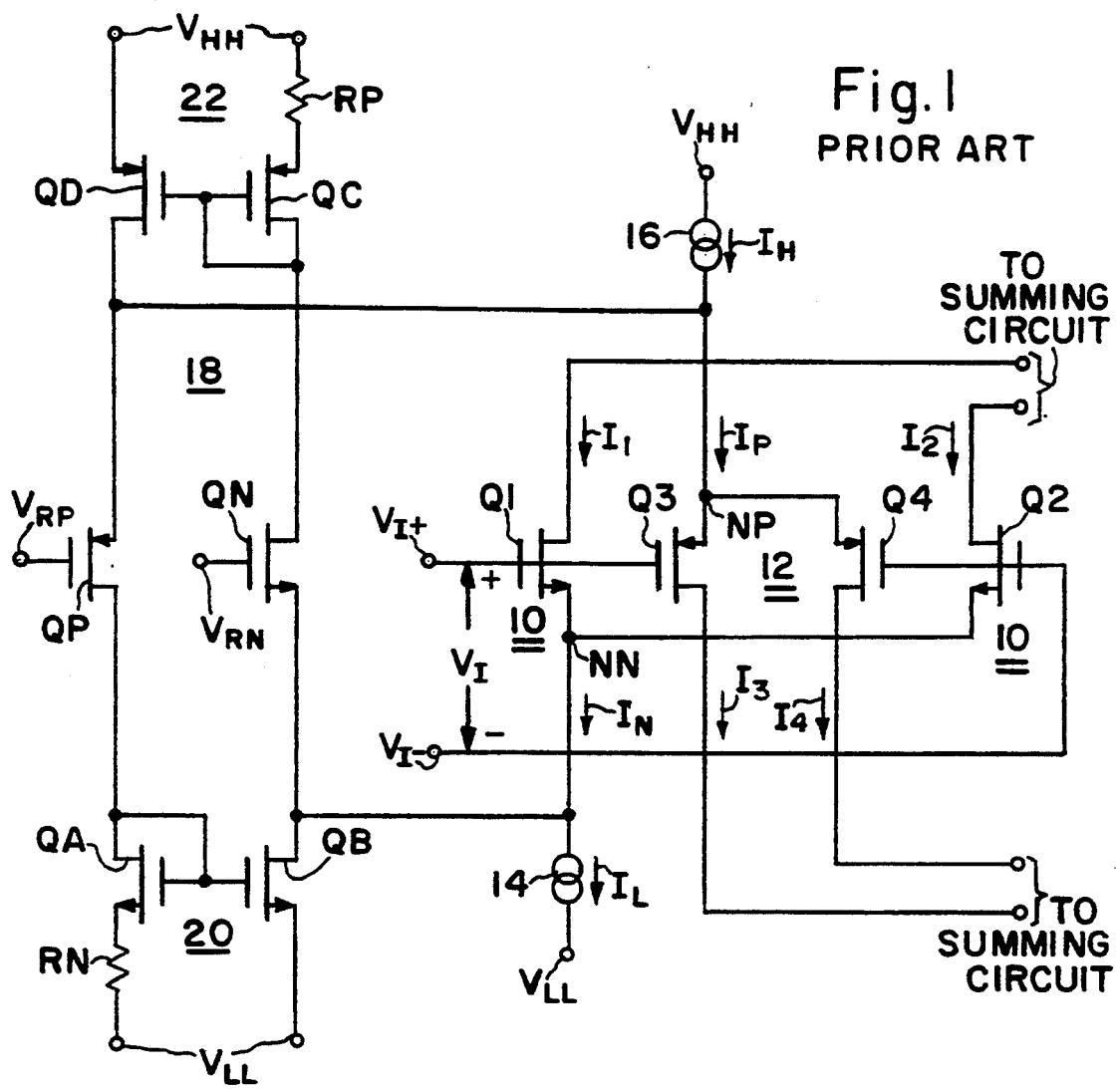
FIG. 1 is a circuit diagram of the input section of a prior art differential amplifier.
Figure 2:
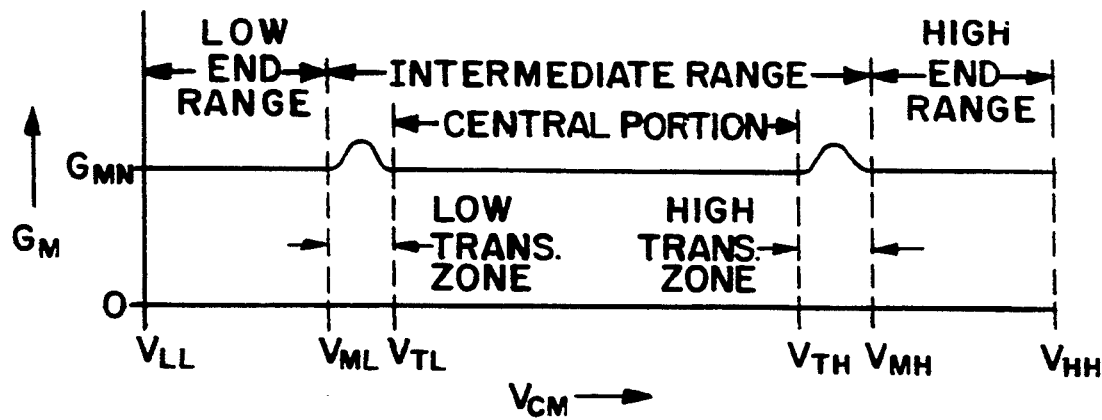
FIG. 2 is an idealized graph of $G_M$ as a function of $V_{CM}$ for a typical implementation of the amplifier in FIG. 1.

Differential portion 10 here consists of substantially identical N-channel insulated-gate main FETs Q1 and Q2 arranged as in FIG. 1 to divide tail current $I_N$ into main currents $I_1$ and $I_2$ in response to differential input $V_I$. The difference between currents $I_1$ and $I_2$ is representative of input $V_I$ when common-mode voltage $V_{CM}$ is in the intermediate and high voltage ranges. Differential portion 12 is here similarly formed with substantially identical P-channel insulated-gate main FETs Q3 and Q4 configured as in FIG. 1 to split tail current $I_P$ into main currents $I_3$ and $I_4$ in response to signal $V_I$. The difference between currents $I_3$ and $I_4$ is representative of input $V_I$ when $V_{CM}$ is in the intermediate and low ranges. Because differential portions 10 and 12 jointly provide representative signal amplification across the intermediate range, the differential amplifier in FIG. 3 has rail-to-rail capability.

Square-root circuit 24, controls tail currents $I_N$ and $I_P$ in such a way that the sum of their square roots—i.e., $I_N^{\frac{1}{2}}+I_P^{\frac{1}{2}}$—is largely constant as $V_{CM}$ moves across the full $V_{PS}$ range during normal circuit operation. Circuit 24, which is connected between the $V_{HH}$ and $V_{LL}$ supplies, preferably contains a pair of substantially identical like-polarity insulated-gate primary control FETs QD1 and QD2 that are used in implementing the square-root summation control on currents $I_N$ and $I_P$. In doing so, circuit 26 relies on the fact that the gate-to-source voltage of each of FETs QD1 and QD2 varies largely with the square root of its drain current when the FET is in strong inversion and saturation. Specific implementations of circuit 24 are described below.

Summing circuit 26, which is also connected between the $V_{HH}$ and $V_{LL}$ supplies, suitably combines main currents $I_1$–$I_4$ to produce one or more amplified output signals. Circuit 26 may be implemented in a number of ways. U.S. Pat. No. 4,555,673 describes several bipolar examples.

Figure 4:
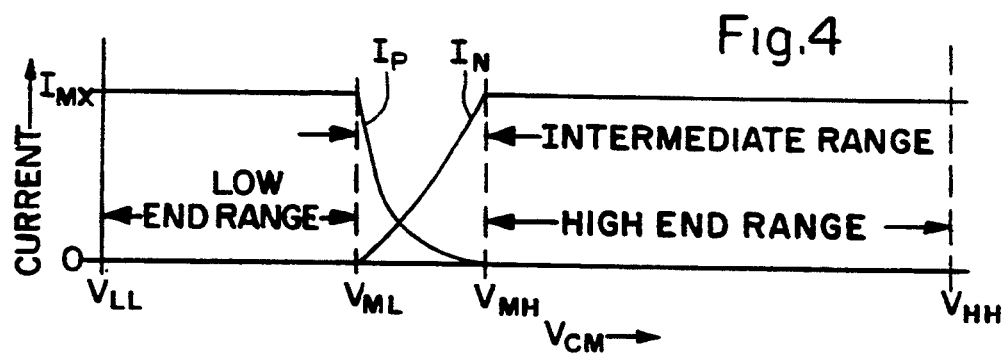
FIGS. 4 and 5 are idealized graphs of tail current and $G_M$ as a function of $V_{CM}$ for the amplifier in FIG. 3.
Figure 5:
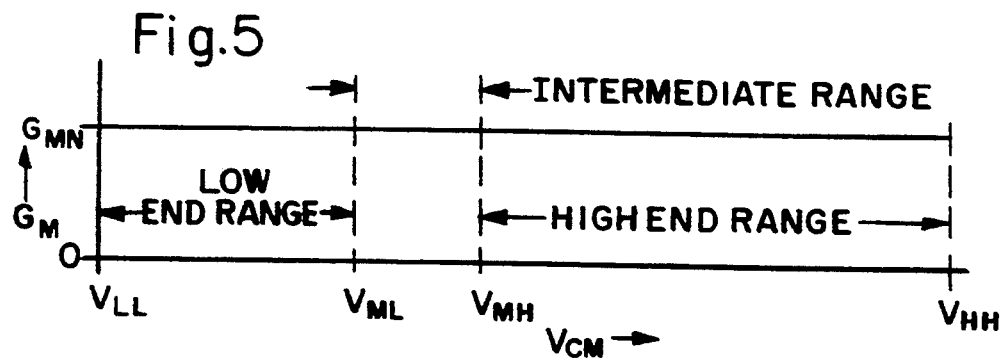

FIGS. 4 and 5 are helpful in understanding how differential portions 10 and 12 in FIG. 3 ideally operate under the current control provided by square-root circuit 24. As a preliminary matter, each portion 10 or 12 is considered to be in a non-amplifying condition if its tail current $I_N$ or $I_P$ is less than or equal to 1% of the total tail current $I_N+I_P$ at any value of $V_{CM}$ in the $V_{PS}$ range. This consideration basically defines the width of the intermediate voltage range.

When $V_{CM}$ is in the low range, square-root circuit 24 sets current $I_N$ at zero. FETs Q1 and Q2 are turned off. Differential portion 10 is inactive—i.e., portion 10 provides no signal amplification. Circuit 24 sets current $I_P$ at a largely constant maximum value $I_{MX}$ as indicated in FIG. 4. Since currents $I_N$ and $I_P$ respectively equal zero and $I_{MX}$, the sum of the square roots of $I_N$ and $I_P$ equals the square root of $I_{MX}$. FETs Q3 and Q4 are fully turned on. Differential portion 12 provides full amplification of input $V_I$.

FETs Q3 and Q4 operate in strong inversion and saturation when $V_{CM}$ is in the low range. Consequently, $G_M$ for the amplifier largely equals $(C_P I_P)^{\frac{1}{2}}$. $C_P$ is an adjustable constant dependent on the characteristics of FETs Q3 and Q4. Since current $I_P$ equals $I_{MX}$ across the low range, $G_M$ largely equals $(C_P I_{MX})^{\frac{1}{2}}$ across the low range. This constant value is nominally indicated as $G_{MN}$ in FIG. 5.

As $V_{CM}$ moves from $V_{ML}$ across the intermediate range up to $V_{MH}$, circuit 24 progressively increases current $I_N$ from zero to $I_{MX}$ as generally indicated in FIG. 4. FETs Q1 and Q2 progressively go from their non-conductive state to a fully conductive state, causing differential portion 10 to go progressively from its non-amplifying state to a full-amplification state. Conversely, circuit 24 progressively decreases $I_P$ from $I_{MX}$ to zero. FETs Q3 and Q4 progressively go from their full-conduction state to a non-conductive state. Differential portion 12 thus progressively goes from its full-amplification state to a non-amplifying state.

Due to the square-root control, the sum of the square roots of $I_N$ and $I_P$ continues to be largely equal to the square root of $I_{MX}$ as $V_{CM}$ moves up through the intermediate range. FETs Q1 and Q2 go into strong inversion and saturation as they become conductive. With FETs Q1–Q4 now all (largely) operating in strong inversion and saturation, $G_M$ largely equals $(C_N I_N)^{\frac{1}{2}}+(C_P I_P)^{\frac{1}{2}}$. $C_N$ is an adjustable constant dependent on the characteristics of FETs Q1 and Q2.

Taking note of the fact that the values of $C_N$ and $C_P$ can be adjusted for any given integrated circuit, $C_N$ is set equal to $C_P$. Since $I_N^{\frac{1}{2}}+I_P^{\frac{1}{2}}$ largely equals $I_{MX}^{\frac{1}{2}}$, $G_M$ is again largely equal to $(C_P I_{MX})^{\frac{1}{2}}$ as $V_{CM}$ moves up through the intermediate range.

When $V_{CM}$ moves from $V_{MH}$ back down to $V_{ML}$, the operation of portions 10 and 12 progressively changes in a manner opposite to that for the upward movement of $V_{CM}$ through the intermediate range. However, $G_M$ remains largely equal to $(C_P I_{MX})^{\frac{1}{2}}$. Consequently, $G_M$ ideally equals the same constant value $G_{MN}$ in the intermediate range as in the low range. See FIG. 5.

The variation in $I_N$ as a function of $V_{CM}$ as it crosses the intermediate range may or may not be a "mirror image" of the variation in $I_P$ as a function of $V_{CM}$ across the intermediate range. FIG. 4 illustrates a case in which the $I_N$ and $I_P$ curves are not mirror images across the intermediate range. Nonetheless, square-root circuit 24 still causes the sum of the square roots of $I_N$ and $I_P$ to largely equal the square root of $I_{MX}$.

Circuit 24 holds current $I_P$ at zero when $V_{CM}$ is in the high range. FETs Q3 and Q4 are now turned off. Differential portion 12 is inactive. Circuit 24 also holds current $I_N$ at $I_{MX}$. The sum of the square roots of $I_N$ and $I_P$ again equals the square root of $I_{MX}$. FETs Q1 and Q2 are now fully turned on. Differential portion 10 provides full amplification of signal $V_I$.

With FETs Q1 and Q2 now in strong inversion and saturation, $G_M$ largely equals $(C_N I_N)^{\frac{1}{2}}$. Since $C_N$ equals $C_P$ and current $I_N$ equals $I_{MX}$ across the high range, $G_M$ remains at $G_{MN}$ across the high range. Again see FIG. 5.

Examination of the entire operation indicates that the square-root control exerted on currents $I_N$ and $I_P$ enables $G_M$ to be ideally constant across the full $V_{PS}$ range. In actual practice, there is some deviation from ideality. However, the deviation is typically small when reasonable precautions are taken with square-root circuit 24. The variation in the sum of the square roots of $I_N$ and $I_P$ is typically less than 10% across the full $V_{PS}$ range. Consequently, the variation in $G_M$ as measured, for example, with reference to the $G_M$ value at the middle of the intermediate range is less than 10% across the $V_{PS}$ range.

The principal way of obtaining the square-root control function in circuit 24 involves arranging FETs QD1 and QD2 in such a way that, during normal circuit operation, they operate in strong inversion and saturation with the sum of their gate-to-source voltages being held largely constant. Under these conditions, the sum of the gate-to-source voltages of FETs QD1 and QD2 is largely equal to the sum of their threshold voltages plus the sum of $(K_1 I_{D1})^{\frac{1}{2}}$ and $(K_2 I_{D2})^{\frac{1}{2}}$. $K_1$ and $K_2$ are adjustable constants respectively dependent on the characteristics of FETs QD1 and QD2. $I_{D1}$ and $I_{D2}$ are the QD1 and QD2 drain currents.

The QD1 and QD2 threshold voltages are fixed values for any given integrated circuit. Since FETs QD1 and QD2 are substantially identical, $K_1$ equals $K_2$. As a result, the sum of the square roots of drain currents $I_{D1}$ and $I_{D2}$—i.e., $I_{D1}^{\frac{1}{2}}+I_{D2}^{\frac{1}{2}}$—is largely constant. Circuit 24 then establishes the square-root summation control on tail currents $I_N$ and $I_P$ by setting them at values respectively equal to $I_{D1}$ and $I_{D2}$.

FETs QD1 and QD2 are preferably employed with a pair of furthest control FETs of the same polarity as FETs QD1 and QD2. The four control FETs are connected together in a loop by way of their gate electrodes and sources. The sum of the gate-to-source voltages of the four control FETs around the loop is zero.

The two further control FETs need not be substantially identical to FETs QD1 and QD2. However, it is normally easier to determine and optimize the necessary circuit parameters when the further control FETs are substantially identical to FETs QD1 and QD2.

The two further control FETs are operated in such a manner that their drain currents are largely constant during normal circuit operation. The two further FETs are also operated in strong inversion and saturation. For the preferred case in which all four control FETs are substantially identical, the sum of the square roots of currents $I_{D1}$ and $I_{D2}$ equals the sum of the square roots of the drain currents for the two further FETs and is therefore largely constant. This provides the necessary internal summation constancy for circuit 24.

FIG. 6 illustrates one way for connecting the four control FETs together in a loop by way of their gate electrodes and sources. In particular, the circuit portion in FIG. 6 consists of four substantially identical P-channel insulated-gate FETs QP1, QP2, QP3, and QP4. The gate electrodes of FETs QP1 and QP3 are connected together. Their sources are connected to the gate electrodes of FETs QP2 and QP4 whose sources are connected together. FETs QP1 and QP2, which correspond to control FETs QD1 and QD2 in FIG. 3, conduct drain currents $I_{D1}$ and $I_{D2}$. Always-on FETs QP3 and QP4 correspond to the two further control FETs and conduct drain currents $I_{D3}$ and $I_{D4}$.

Turning to FIG. 7, it indicates how the circuit portion in FIG. 6 can be further arranged to hold drain currents $I_{D3}$ and $I_{D4}$ at constant values during normal circuit operation. As shown in FIG. 7, the drains of FETs QP3 and QP4 are connected back to their gate electrodes. A current source 28 that supplies a constant current $I_{L1}$ is connected between the $V_{LL}$ supply and the QP3 drain. Currents $I_{D3}$ and $I_{D4}$ are now both fixed at $I_{L1}$. When FETs QP1 and QP2 are in strong inversion and saturation, $I_{D1}^{\frac{1}{2}}+I_{D2}^{\frac{1}{2}}$ thus equals $2I_{L1}^{\frac{1}{2}}$ which, in turn, equals $(4I_{L1})^{\frac{1}{2}}$.

A current source 30, which supplies a constant current $I_{H1}$, is connected between the $V_{HH}$ supply and a node NA along the junction between the QP1 source and the QP2 gate electrode. A current tap that carries a steering current $I_A$ equal to $I_{H1}-I_{D1}$ is taken from node NA. The tap allows current $I_{D1}$ to vary. Finally, the interconnected sources of FETs QP2 and QP4 are connected to the $V_{HH}$ supply to provide a high-voltage current supply for FETs QP2 and QP4. This connection also allows current $I_{D2}$ to vary. Because $I_{D1}^{\frac{1}{2}}+I_{D2}^{\frac{1}{2}}$ equals $(4I_{L1})^{\frac{1}{2}}$ when FETs QP1 and QP2 are in strong inversion and saturation, each of currents $I_{D1}$ and $I_{D2}$ ideally varies from zero to $4I_{L1}$.

FIG. 8 illustrates a preferred embodiment of the input section of the differential amplifier of FIG. 3 in which the circuit portion shown in FIG. 7 constitutes part of square-root circuit 24. In particular, the circuit portion in FIG. 7 forms a current-control circuit 32 in FIG. 8. Current $I_{D2}$ is provided identically as tail current $I_P$ in FIG. 8. Supply current $I_{L1}$ is set at a reference value $I_R$. Supply current $I_{H1}$ is set at $4I_R$.

Square-root circuit 24 in FIG. 8 also contains a steering circuit 34 consisting of a general steering transistor Q5 and a current source 36 that supplies a constant current $I_{L2}$. Current source 36 is connected between node NN and the $V_{LL}$ supply. As with supply current $I_{H1}$, supply current $I_{L2}$ is set at $4I_R$.

Steering transistor Q5 can be implemented as an N-channel FET or as an NPN transistor. Its first and second flow electrodes are respectively connected to nodes NN and NA to set up a current path from node NA to node NN. A constant reference voltage $V_{B1}$ is furnished to the Q5 control electrode. Reference voltage $V_{B1}$, which sets the middle of the intermediate range, is preferably matched to the Q5 threshold voltage such that the minimum voltage at node NN is just slightly above the minimum needed to keep current source 36 always on and functioning properly.

Square-root circuit 24 ideally functions in the following way in FIG. 8. Because supply currents $I_{H1}$ and $I_{L2}$ are both set at the same level ($4I_R$), tail current $I_N$ largely equals $I_{D1}$. As mentioned above, $I_{D1}^{\frac{1}{2}}+I_{D2}^{\frac{1}{2}}$ equals $(4I_{L1})^{\frac{1}{2}}$ when transistors QP1 and QP2 are in strong inversion and saturation. Since supply current $I_{L1}$ equals $I_R$, $I_N^{\frac{1}{2}}+I_P^{\frac{1}{2}}$ is ideally forced to be largely equal to $(4I_R)^{\frac{1}{2}}$. Steering current $I_A$ through transistor Q5 in circuit 34 largely equals $4I_R$ since current $I_A$ is equal to $I_{H1}-I_{D1}$. While not being largely equal to tail current $I_N$, current $I_A$ is determinative of $I_N$. Also, current $I_A$ can vary from zero to $4I_R$.

Transistor Q5 operates in a differential manner with FETs Q1 and Q2 in response to changes in $V_{CM}$. Note that $V_{CM}$ does not physically exist at any actual point in the amplifier. However, changes in $V_{CM}$ are manifested by the voltage at node NN insofar as changes in the conductive level of transistor Q5 are concerned.

Steering current $I_A$ varies with $V_{CM}$ and is not directly dependent on the action of current-control circuit 32. Consequently, tail current $I_N$ is not directly dependent on the action of circuit 32. If a change in $V_{CM}$ causes current $I_N$ to change, circuit 32 adjusts the conductive level of FET QP2 so that. $I_N^{\frac{1}{2}}+I_P^{\frac{1}{2}}$ largely equals $(4I_R)^{\frac{1}{2}}$. In fact transistor Q5 could be described as an element that senses changes in current $I_N$. Circuit 32 then constitutes a subtracting circuit for adjusting tail current $I_P$ in such a way that $I_P^{\frac{1}{2}}$ largely equals $(4I_R)^{\frac{1}{2}}-I_N^{\frac{1}{2}}$.

When $V_{CM}$ is in the low range, transister Q5 is highly conductive and draws current $I_A$ at its maximum level. That is, current $I_A$ equals $4I_R$. Current $I_N$ is zero. The voltage at node NA is sufficiently low that FET QP1 is off. Current $I_{D1}$ is also zero. FET QP2 is highly conductive. Since circuit 32 ideally forces $I_P^{\frac{1}{2}}$ to equal $(4I_R)^{\frac{1}{2}}-I_N^{\frac{1}{2}}$, current $I_P$ is ideally supplied at a value equal to $4I_R$.

As $V_{CM}$ moves up through the intermediate range from $V_{ML}$ to $V_{MH}$, transistor Q5 progressively shuts down the current path from node NA to node NN. In particular, transistor Q5 progressively goes from full conduction to a substantially non-conductive state. Current $I_A$ drops progressively from $4I_R$ to zero. This causes current $I_N$ to increase progressively from zero to $4I_R$.

The voltage at node NA progressively rises to a high level as transistor Q5 turns off. FET QP1 turns on and progressively goes to a highly conductive state. Current $I_{D1}$ follows current $I_N$ up to $4I_R$. FET QP2 progressively goes from its highly conductive state to a non-conductive state. Current $I_P$ drops progressively from $4I_R$ to zero. During this drop, the square-root control causes $I_P^{\frac{1}{2}}$ to be ideally equal to $(4I_R)^{\frac{1}{2}} - I_N^{\frac{1}{2}}$.

When $V_{CM}$ is the high range, transistor Q5 is non-conductive. FETs QP1 and QP2 and currents $I_A$, $I_{D1}$, $I_P$, and $I_N$ are at the opposite states or values from those existing when $V_{CM}$ is in the low range.

FETs QP1 and QP2 are in strong inversion and saturation only when currents $I_{D1}$ and $I_{D2}$ ($I_P$) are sufficiently large. During normal circuit operation, one or the other of them occasionally becomes too small to maintain the strong inversion/saturation state. Deviation from the ideal square-root behavior occurs. Due to the subtractive nature of the current control, the deviation is not particularly troublesome in the amplifier of FIG. 8 if current $I_{D2}$ ($I_P$) becomes too small. However, if current $I_{D1}$ becomes too small, the voltage at node NA drops too low and causes FET QP2 to become too conductive. The end result is that current $I_{D2}$ rises to a level significantly greater than $4I_R$.

Figure 9:
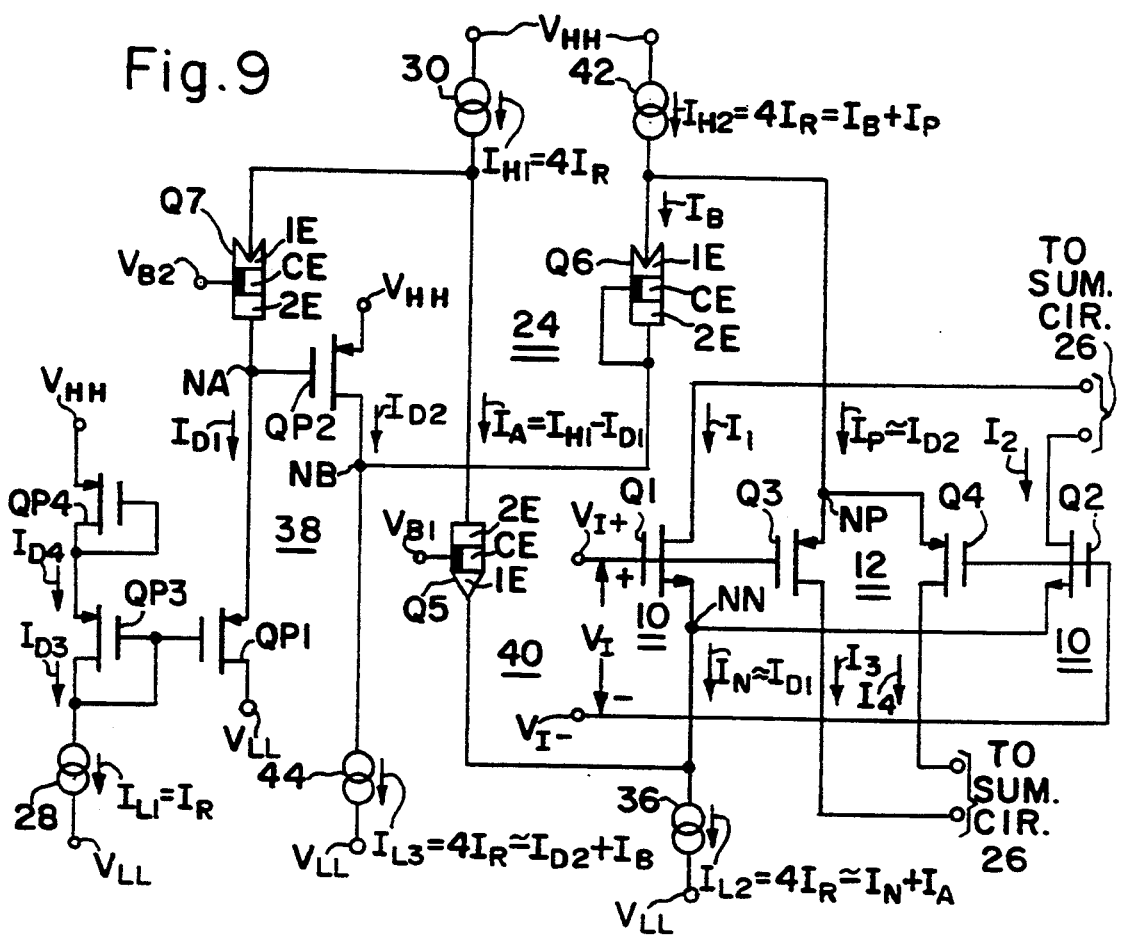

FIG. 9 illustrates a variation of the input section of the differential amplifier in FIG. 8. This variation significantly overcomes the preceding difficulty. Square-root circuit 24 in FIG. 9 is formed with a current-control circuit 38 and a steering circuit 40.

Current-control circuit 38 contains FETs QP1–QP4 and current sources 28 and 30 all arranged the same as in FIG. 8 except that the QP2 drain is not connected directly to node NP. Instead, node NP is connected to the first flow electrode of a general current-limiting transistor Q6 whose control and second flow electrodes are connected together through node NP to the QP2 drain. Transistor Q6, which may be implemented as a P-channel FET or as a PNP transistor, conducts an adjustment current $I_B$. A current source 42 that furnishes a constant current $I_{H2}$ is connected between the $V_{HH}$ supply and node NP. A current source 44 that furnishes a constant current $I_{L3}$ is similarly connected between node NB and the $V_{LL}$ supply.

Supply currents $I_{H2}$ and $I_{L3}$ are both set at $4I_R$. As a result, current $I_P$ largely equals current $I_{D2}$ in magnitude even though they are now separate currents.

Transistor Q6 functions as a diode to prevent any of current $I_{D2}$ from actually flowing to node NP. Transistor Q6 is highly conductive when FET QP2 is at a low conductive level and vice versa. The combination of transistor Q6 and current sources 42 and 44 limits current $I_P$ to a maximum of $4I_R$ and brings the current-control quite close to the ideal square-root behavior. Reference value $I_R$ is sufficiently great that FETs QP1–QP4 are always in strong inversion and saturation during normal circuit operation.

Steering circuit 40 in FIG. 9 contains transistor Q5 and current source 36 both arranged the same as in FIG. 8 except that a general bias transistor Q7 lies between current source 30 and node NA. Transistor Q7 can be implemented as a P-channel FET or as a PNP transistor. Its first and second flow electrodes are respectively connected to current source 30 and node NA. The Q7 control electrode receives a constant reference voltage $V_{B2}$.

Transistor Q7 does not affect $G_M$. Instead, transistor Q7 raises the voltage level that the second flow electrode of transistor Q5 can reach. This ensures that transistor Q5 functions in the desired manner.

If the differential amplifier in FIG. 9 is implemented in "CMOS", transistors Q5–Q7 are implemented with insulated-gate FETs of the polarities given above. Each of current sources 28, 36, and 44 consists of one or more N-channel insulated-gate FETs. Each of current sources 30 and 42 is formed with one or more P-channel insulated-gate FETs. $I_R$ preferably is 5 microamps. $V_{ML}$ and $V_{MH}$ respectively are 1.2 and 1.8 volts. $V_{B1}$ is 1.5 volts referenced to $V_{LL}$.

Figure 10:
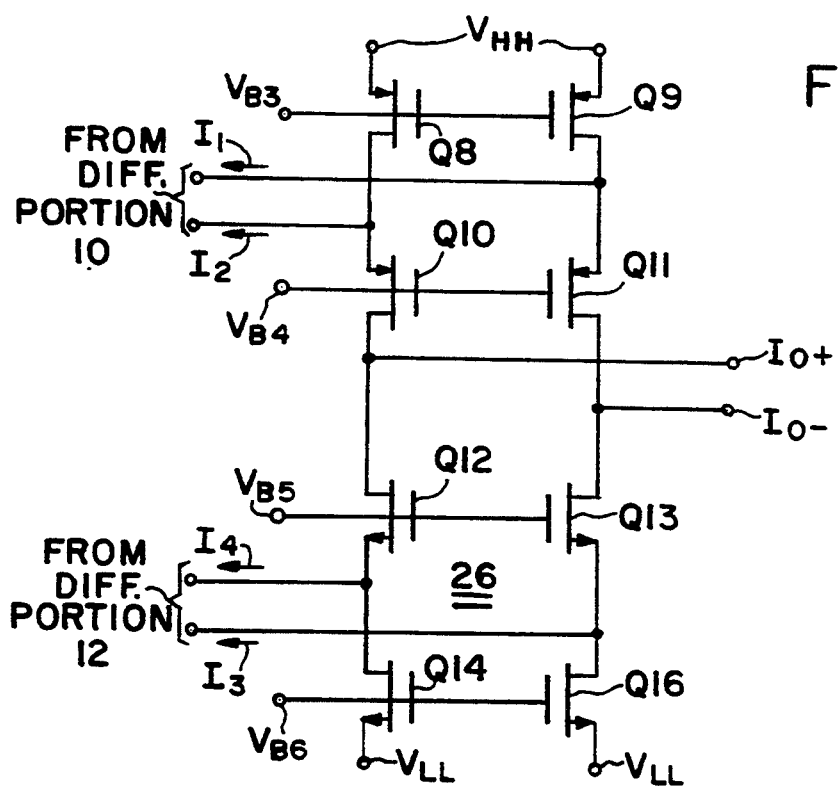
FIG. 10 is a circuit diagram for a preferred embodiment of the summing circuit for the amplifier of FIG. 9.

For the "CMOS" implementation, summing circuit 26 is preferably implemented in a manner such as that shown in FIG. 10. Circuit 26 in FIG. 10 contain P-channel insulated-gate FETs Q8, Q9, Q10, and Q11 and N-channel insulated-gate FETs Q12, Q13, Q14, and Q15 all arranged in the indicated manner. Signals $V_{B3}$, $V_{B4}$, $V_{B5}$, and $V_{B6}$ are constant reference voltages. FETs Q8–Q15 all operate in a manner evident to a person skilled in the semiconductor amplifier circuitry art to produce complementary output currents $I_{o+}$ and $I_{o-}$.

If the amplifier in FIG. 9 is implemented in "BICMOS", transistors Q5–Q7 preferably all are bipolar transistors of the polarities given above. Each of current sources 28, 36, and 44 preferably consists of one or more NPN transistors. Each of current sources 30 and 42 could consist of one or more PNP transistors but preferably remains one or more P-channel FETs. In summing circuit 26 in FIG. 10, PNP transistors are preferably substituted for FETs Q10 and Q11. NPN transistors are preferably substituted for FETs Q12–Q15.

Figure 11:
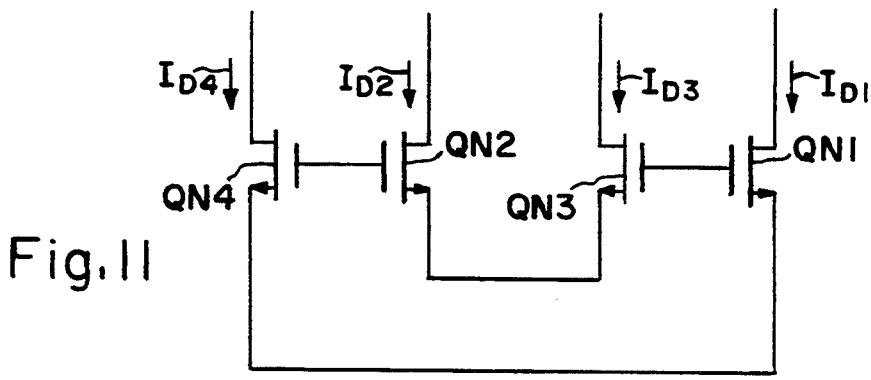
FIG. 11 is a circuit diagram for another preferred implementation of part of the square-root circuit in the amplifier of FIG. 3.

FIG. 11 depicts another way of connecting four FETs together in a loop by way of their gate electrodes and sources. The circuit portion in FIG. 11 is formed with four substantially identical N-channel insulated-gate FETs QN1, QN2, QN3, and QN4. The gate electrodes of FETs QN1 and QN3 are connected together. Their sources are connected to the sources of FETs QN4 and QN2 whose gate electrodes are connected together. FETs QN1 and QN2 correspond to FETs QD1 and QD2 in FIG. 3 and transmit drain currents $I_{D1}$ and $I_{D2}$. FETs QN3 and QN4, which correspond to the further control FETs described above, conduct drain currents $I_{D3}$ and $I_{D4}$.

Figure 12:
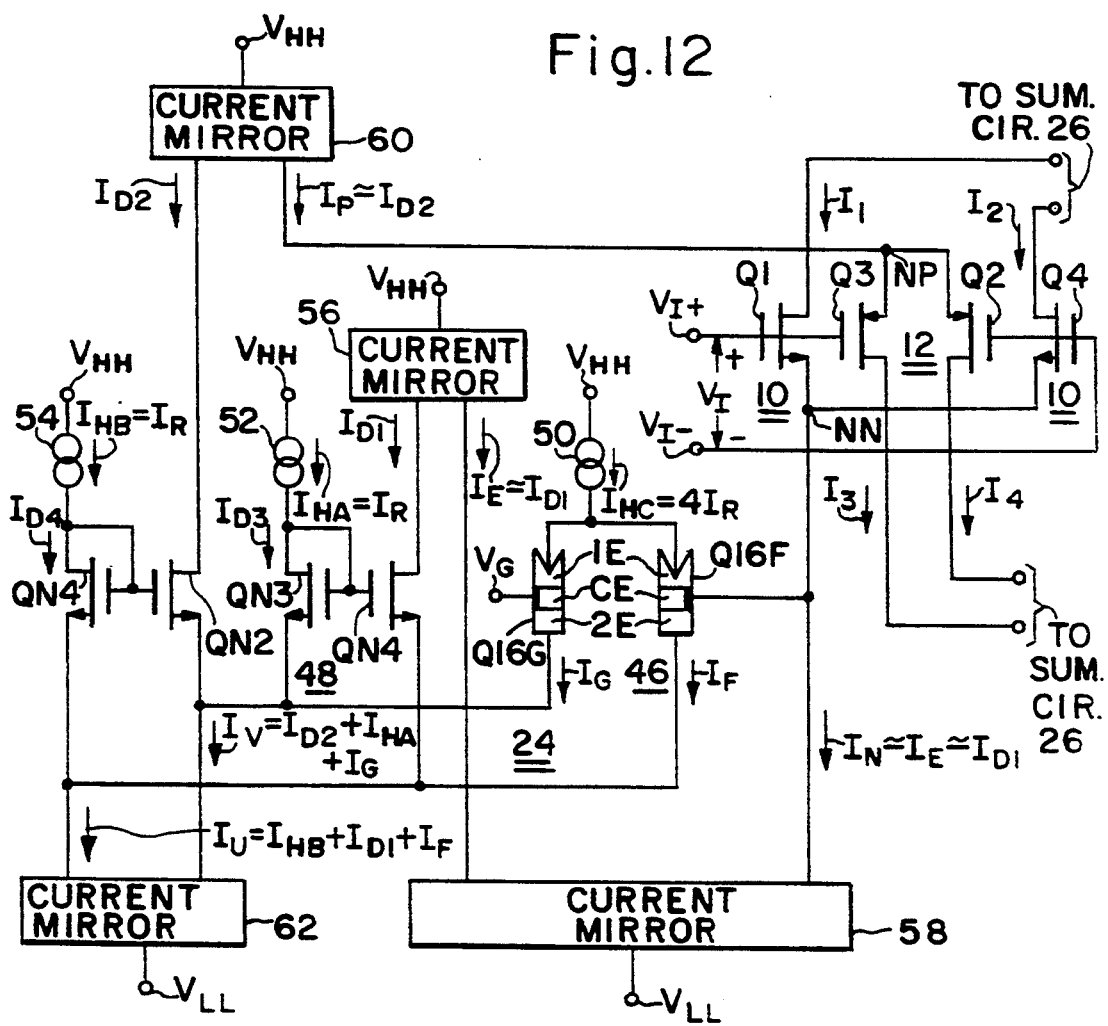
FIG. 12 is a circuit diagram for another preferred embodiment of the input section of the amplifier in FIG. 3.

Turning to FIG. 12, it shows a preferred embodiment of the input section of the amplifier in FIG. 3 in which FETs QN1–QN4 form part of square-root circuit 24. More specifically, circuit 24 in FIG. 12 consists of a sensing circuit 46 and a current-control circuit 48 containing FETs QN1–QN4.

Sensing circuit 46 is a differential amplifier formed with substantially identical like-polarity general input transistors Q16F and Q16G and a current source 50 as shown in FIG. 12. Transistors Q16F and Q16G may be implemented as P-channel FETs or as PNP transistors. They supply individual adjustment currents $I_F$ and $I_G$ as their output currents in response to the difference between the voltage at node NN and a constant reference voltage $V_G$. The value chosen for $V_G$ sets the location of the intermediate range within the $V_{PS}$ range. The midpoint of the intermediate range exceeds $V_G$ by an amount approximately equal to the threshold voltage of FETs Q1 and Q2. Current source 50 supplies a constant tail current $I_{HC}$ jointly to transistors Q16F and Q16G.

The drains of FETs QN3 and QN4 in current-control circuit 48 are respectively connected back to their gate electrodes. In addition to FETs QN1–QN4, circuit 48 contains current sources 52 and 54 and current mirrors 56, 58, 60, and 62, all connected as shown in FIG. 12. Current source 52 provides a constant current $I_{HA}$ to the QN3 drain. Current source 54 similarly furnishes a constant current $I_{HB}$ to the QN4 drain.

Each of current mirrors 56–62 consists of a pair of substantially identical like-polarity general transistors (not shown explicitly) whose control electrodes are connected together. In each transistor pair, the transistor that carries the current which is to be duplicated has its second flow electrode connected back to its control electrode in a conventional manner. For a "CMOS" implementation, current mirrors 56 and 60 use P-channel insulated-gate FETs while current mirrors 58 and 62 use N-channel insulated-gate FETs.

With the foregoing in mind, square-root circuit 24 in FIG. 12 ideally operates as follows. Circuit 46 senses changes in $V_{CM}$, as represented by the voltage at node NN, and produces a differential adjustment signal representative of the $V_{CM}$ changes. This differential signal is the difference between currents $I_F$ and $I_G$. Supply current $I_{HC}$ equals $4I_R$. Accordingly, currents $I_F$ and $I_G$ can each vary from zero to $4I_R$.

Supply currents $I_{HA}$ and $I_{HB}$ both equal $I_R$. Always-on FETs QN3 and QN4 thus conduct drain currents $I_{D3}$ and $I_{D4}$ at levels equal to $I_R$. When FETs QN1 and QN2 are in strong inversion and saturation, $I_{D1}^{\frac{1}{2}}+I_{D2}^{\frac{1}{2}}$ equals $I_{D3}^{\frac{1}{2}}+I_{D4}^{\frac{1}{2}}$ which, in turn, equals $I_R^{\frac{1}{2}}+I_R^{\frac{1}{2}}$. That is, $I_{D1}^{\frac{1}{2}}+I_{D2}^{\frac{1}{2}}$ equals $(4I_R)^{\frac{1}{2}}$ just as in square-root circuit 24 of FIGS. 8 and 9.

Current mirror 56 mirrors current $I_{D1}$ to produce a largely equal current $I_E$. In turn, current mirror 58 mirrors current $I_E$ to produce current $I_N$ at a largely equal value. Current $I_N$ thereby largely equals $I_{D1}$. Current mirror 60 mirrors current $I_{D2}$ to produce current $I_P$ at a largely equal value. Assuming that FETs QN1 and QN2 are in strong inversion and saturation, $I_N^{\frac{1}{2}}+I_P^{\frac{1}{2}}$ then equals $(4I_R)^{\frac{1}{2}}$ as in FIGS. 8 and 9.

Current mirror 62 mirrors a current $I_U$ to produce a largely equal current $I_V$. Examination of FIG. 12 indicates that current $I_U$ equals $I_{D1}+I_F+I_R$. Similarly, current $I_V$ equals $I_{D2}+I_R+I_G$. The tail current difference $I_P-I_N$ largely equals the difference $I_{D2}-I_{D1}$ which, in turn, largely equals the difference $I_G-I_F$ since $I_V$ largely equals $I_U$. Because currents $I_F$ and $I_G$ can each vary from zero to $4I_R$, the difference $I_P-I_N$ can vary largely across the range extending from $-4I_R$ to $+4I_R$ but not beyond that range. Consequently, square-root circuit 24 in FIG. 12 automatically avoids the difficulty with circuit 24 in FIG. 8 where current $I_P$ can become greater than $4I_R$.

When $V_{CM}$ is in the low range, transistor Q16G is at full conduction while transistor Q16F is turned off. Current $I_G$ equals $4I_R$. Current $I_F$ equals zero. Transistor QN2 is fully conductive. Currents $I_{D2}$ and $I_P$ both equal $4I_R$. FET QN1 is turned off. Currents $I_{D1}$ and $I_N$ are both zero.

As $V_{CM}$ moves up through the intermediate range, transistor Q16F progressively turns on while transistor Q16G progressively turns off. Current $I_F$ rises progressively to $4I_R$ as current $I_G$ drops progressively to zero. FET QN1 turns on and progressively goes to a fully conductive state as FET QN2 progressively becomes less conductive.

Currents $I_{D1}$ and $I_N$ progressively rise up largely to $4I_R$ as currents $I_{D2}$ and $I_P$ drop to zero. In doing so, current-control circuit 48 individually adjusts the values of both currents $I_N$ and $I_P$ as a function of $V_{CM}$ such that $I_N^{\frac{1}{2}}+I_P^{\frac{1}{2}}$ largely equals $(4I_R)^{\frac{1}{2}}$. Since constant $C_N$ for FETs Q1 and Q2 has been set equal to constant $C_P$ for FETs Q3 and Q4, the variation in $I_N$ as a function of $V_{CM}$ across the intermediate range is largely a mirror image of the variation in $I_P$ as a function of $V_{CM}$ across the intermediate range.

When $V_{CM}$ is in the high range, transistors Q16F, Q16G, QN1, and QN2 are in the opposite states from the low range. Similar comments apply to currents $I_F$, $I_G$, $I_{D1}$, $I_{D2}$, $I_N$, and $I_P$.

Square-root circuit 24 in FIG. 12 is quite fast because it operates on a differential principle in sensing $V_{CM}$. As indicated above, current-control circuit 48 is arranged in a way that inherently prevents each of tail currents $I_P$ and $I_N$ from exceeding $4I_R$. The deviation from ideal square-root behavior is thus quite small. In addition, the "body effects" associated with FETs QM–QN4 cancel so that they can be fabricated in a common well. This further speeds up the amplifier by reducing parasitic capacitances.

While the invention has been described with reference to the preferred embodiments, this description is solely for the purpose of illustration and is not to be construed as limiting the scope of the invention claimed below. For example, the polarities of all the transistors in FIGS. 6–12 could be reversed to achieve substantially the same results. Using suitable current sources, drain currents $I_{D3}$ and $I_{D4}$ could be set at non-equal values.

Junction FETs could be used in place of insulated-gate FETs since the gate-to-source voltage of a junction FET varies with the square root of its drain current when the junction FET is in strong inversion and saturation. This applies to square-root circuit 24 as well as differential portions 10 and 12. An input voltage level-shifting circuit, such as that described in U.S. Pat. No. 4,918,398, could be used to obtain rail-to-rail input capability down to a power supply voltage below 2 volts. Various modifications and applications may thus be made by those skilled in the art without departing from the true scope and spirit of the invention as defined in the appended claims.

We claim:

1. An electronic circuit operable between first and second supply voltages which constitute a power supply range including a first end range extending to the first supply voltage, a second end range extending to the second supply voltage, and an intermediate range extending between the end ranges, the circuit comprising:
   first differential means for amplifying a differential input signal by largely dividing a first tail current into a pair of first main currents whose difference is representative of the input signal when its common-mode voltage $V_{CM}$ is in the intermediate and first ranges;
   second differential means for amplifying the input signal by largely dividing a second tail current into a pair of second main currents whose difference is representative of the input signal when $V_{CM}$ is in the intermediate and second ranges; and
   square-root means comprising a pair of primary control FETs having respective gate-to-source voltage whose sum is held largely constant during normal circuit operation, for controlling the tail currents so that the sum of their square roots is largely constant during circuit operation as $V_{CM}$ traverses the entire intermediate range and the end ranges.

2. A circuit as in claim 1 wherein the square root means controls the tail currents such that a variation in the sum of the square roots of the tail currents is less than 10% during circuit operation as $V_{CM}$ fully traverses the intermediate range.

3. A circuit as in claim 2 wherein the square-root means includes a pair of further control FETs each having respective gate electrodes and sources which control FETs each conduct respective drain currents that are held largely constant during circuit operation, the four control FETs being coupled together in a loop by way of their gate electrodes and sources, whereby the sum of their gate-to-source voltages around the loop equals zero.

4. A circuit as in claim 1 wherein the square-root means maintains the sum of the square roots of the tail currents at a largely constant value during circuit operation as $V_{CM}$ traverses substantially all of the power-supply range.

5. A circuit as in claim 1 wherein the first differential means progressively goes from a substantially non-amplifying state to a substantially full-amplification state, while the second differential means does the opposite, as $V_{CM}$ moves fully through the intermediate range towards the first supply voltage, and vice versa as $V_{CM}$ moves fully through the intermediate towards the second supply voltage.

6. A circuit as in claim 4 wherein the first differential means provides substantially no amplification when $V_{CM}$ is in the second end range, and the second differential means provides substantially no amplification when $V_{CM}$ is in the first end range.

7. A circuit as in claim 1 further including summing means for combining the main currents to produce at least one output current.

8. A circuit as in claim 1 wherein:
the first differential means comprises a pair of like-polarity differentially coupled first main field-effect transistors (FETs) that differentially respond to the input signal by largely dividing the first tail current between the first main currents; and the second differential means comprises a pair of like-polarity differentially coupled second main FETs that differentially respond to the input signal by largely dividing the second tail current between the second main currents, the second main FETs being complementary to the first main FETs.

9. A circuit as claimed in claim 8 wherein the primary control FETs each conduct respective drain currents and wherein the square-root means sets the tail currents at values respectively largely proportional in magnitude to the drain currents of the primary control FETs.

10. A circuit as in claim 9 wherein the tail currents are respectively largely equal in magnitude to the drain currents of the primary control FETs.

11. A circuit as claimed in claim 1 wherein the square-root means includes a pain of further like-polarity control FETs, each having respective gate electrodes and sources, and wherein the four control FETs are coupled together in a loop by way of their gate electrodes and sources, whereby the sum of their gate-to-source voltages around the loop equals zero.

12. A circuit as in claim 11 wherein the gate electrodes of two of the control FETs are coupled together, the sources of these two control FETs being respectively coupled to the gate electrodes of the other two control FETs whose sources are coupled together.

13. A circuit as in claim 12 wherein the control FETs each conduct respective drain currents and wherein the square-root means sets the tail currents respectively largely equal in magnitude to the drain currents of two of the control FETs, the drain currents of the other two control FETs being held largely constant during circuit operation.

14. A circuit as in claim 11 wherein the gate electrodes of two of the control FETs are coupled together, the sources of the two control FETs being respectively coupled to the sources of the other two control FETs whose gate electrodes are coupled together.

15. A circuit as in claim 14 wherein the control FETs each conduct respective drain currents and wherein the square-root means sets the tail currents respectively largely equal in magnitude to the drain currents of two of the control FETs, the drain currents of the other two control FETs being held largely constant during circuit operation.

16. A circuit as in claim 1 wherein:
the first differential means comprises a pair of like-polarity first main field-effect transistors (FETs) having respective gate electrodes differentially responsive to the input signal, respective sources coupled together through a first node for jointly conducting the first tail current, and respective drains for respectively conducting the first main currents; and
the second differential means comprises a pair of like-polarity second main FETs having respective gate electrodes differentially responsive to the input signal, respective sources coupled together through a second node for jointly conducting the second tail current, and respective drains for respectively conducting the second main currents, the second main FETs being complementary to the first main FETs.

17. A circuit as in claim 16 wherein the square-root means comprises:
steering means for adjusting a current path to the first node in response to changes in $V_{CM}$; and
control means for providing the current path with a current determinative of the first tail current and for providing the second tail current at the second node.

18. A circuit as in claim 17 wherein the control means comprises said pair of primary control FETs having like polarity, the control means setting the tail currents at respective values largely equal in magnitude to the drain currents of the primary control FETs.

19. A circuit as in claim 18 wherein the control means includes a pair of further control FETs each having respective gate electrodes and sources which control FETs each conduct respective drain currents that are held largely constant during circuit operation, the four control FETs being coupled together in a loop by way of their gate electrodes and sources, whereby the sum of their gate-to-source voltages around the loop equals zero.

20. A circuit as in claim 19 wherein the steering means comprises:
a steering transistor having a first flow electrode coupled to the first node, a second flow electrode coupled to the control means, and a control electrode for regulating current transmission between the flow electrodes in response to a reference voltage so as to set up the current path; and
a current source coupled between the first node and the second supply voltage.

21. A circuit as in claim 20 wherein the steering transistor is a bipolar transistor.

22. A circuit as in claim 16 wherein the square-root means comprises:
sensing means for producing an adjustment signal representative of changes in $V_{CM}$; and control means responsive to the adjustment signal for respectively providing the first and second nodes with the first anti second tail currents at values dependent on $V_{CM}$.

23. A circuit as in claim 22 wherein the control means comprises said pair of primary control FETs having like-polarity, the control means setting the tail currents at respective values largely equal in magnitude to the drain currents of the primary control FETs.

24. A circuit as in claim 23 wherein the control means includes a pair of further control FETs each having respective gate electrodes and sources which control FETs each conduct respective drain currents that are held largely constant during circuit operation, the four control FETs being coupled together in a loop by way of their gate electrodes and sources, whereby the sum of their gate-to-source voltages around the loop equals zero.

25. A circuit as in claim 24 wherein the sensing means comprises a differential amplifier for producing the adjustment signal as a differential signal in response to the difference between a reference voltage and the voltage at one of the nodes.

26. A circuit as in claim 1 wherein said gate-to-source voltages are largely independent of the input signal.

27. A circuit as claimed in claim 26, wherein said square root means includes only a single pair of said primary control FETs.

28. An electronic circuit operable between first and second supply voltages which constitute a power supply range including a first end range extending to the first supply voltage, a second end range extending to the second supply voltage, and an intermediate range extending between the end ranges, the circuit comprising:

first differential means for amplifying a differential input signal by largely dividing a first tail current into a pair of first main currents whose difference is representative of the input signal when its common-mode voltage $V_{CM}$ is in the intermediate and first ranges;

second differential means for amplifying the input signal by largely dividing a second tail current into a pair of second main currents whose difference is representative of the input signal when $V_{CM}$ is in the intermediate and second ranges; and square root means comprising four like-polarity control FETs, each having respective gate electrodes and sources, coupled together in a loop by way of their gate electrodes and sources, whereby the sum of their gate-to-source voltages around the loop equal zero, for controlling the tail currents so that the sum of their square roots is largely constant during circuit operation as $V_{CM}$ traverses the entire intermediate range and the end ranges.

29. A circuit as in claim 28 wherein the gate electrodes of two of the control FETs are coupled together, the sources of these two control FETs being respectively coupled to the gate electrodes of the other two control FETs whose sources are coupled together.

30. A circuit as in claim 29 wherein the control FETs each conduct respective drain currents and wherein the square-root means sets the tail currents respectively largely equal in magnitude to the drain currents of two of the control FETs, the drain currents of the other two control FETs being held largely constant during circuit operation.

31. A circuit as in claim 28 wherein the gate electrodes of two of the control FETs are coupled together, the sources of the two control FETs being respectively coupled to the sources of the other two control FETs whose gate electrodes are coupled together.

32. A circuit as in claim 31 wherein the control FETs each conduct respective drain currents and wherein the square-root means sets the tail currents respectively largely equal in magnitude to the drain currents of two of the control FETs, the drain currents of the other two control FETs being held largely constant during circuit operation.

* * * * *